United States Patent [19]

Hayakawa et al.

[11] Patent Number: 4,878,083
[45] Date of Patent: Oct. 31, 1989

[54] PRESSURE DEVELOPING DEVICE IN IMAGE RECORDING APPARATUS

[75] Inventors: Kiyoharu Hayakawa; Takashi Tomizawa, both of Aichi, Japan

[73] Assignee: Brother Kogyo Kabushiki Kaisha, Aichi, Japan

[21] Appl. No.: 221,612

[22] Filed: Jul. 20, 1988

[30] Foreign Application Priority Data

Jul. 21, 1987 [JP] Japan .............................. 62-112494

[51] Int. Cl.[4] ...................... G03B 27/32; G03B 27/52
[52] U.S. Cl. ..................................... 355/27; 355/100; 355/106
[58] Field of Search .................. 355/27, 100, 106; 430/138

[56] References Cited

U.S. PATENT DOCUMENTS

| 4,135,809 | 1/1979 | Ponce ............................. 355/27 |
| 4,392,734 | 7/1983 | Plumadore ..................... 355/27 |
| 4,448,516 | 5/1984 | Arney et al. ................... 355/27 |
| 4,624,560 | 11/1986 | Beery ............................. 355/27 |

Primary Examiner—Monroe H. Hayes
Attorney, Agent, or Firm—Oliff & Berridge

[57] ABSTRACT

A pressure developing device has a pair of pressure developing rollers for pressing a photosensitive and pressure-sensitive recording sheet with a latent image formed thereon and a color developer sheet in overlapping relation to develop the latent image into a visible image and transfer the visible image onto the color developer sheet. The pressure developing rollers have respective pressing surfaces for pressing the photosensitive and pressure-sensitive recording sheet and the color developer sheet, and at least one of the rollers has non-pressing surface extending axially of the roller.

6 Claims, 1 Drawing Sheet

PRESSURE DEVELOPING DEVICE IN IMAGE RECORDING APPARATUS

BACKGROUND OF THE INVENTION

The present invention relates generally to an image recording apparatus, and more particularly to a pressure developing device in such a recording apparatus for pressing a pressure-sensitive recording sheet to develop and transfer a recorded image onto a color developer sheet.

A recording sheet applicable to the pressure developing device is disclosed in Japanese Laid-Open Patent Publication No. 58-17432. The recording sheet is in the form of a photosensitive and pressure-sensitive recording sheet coated on one surface with photocuring microcapsules encapsulating dye precursors. An image on an image carrying sheet is recorded on the photosensitive and pressure-sensitive recording sheet as a latent image. The latent image is formed in such a way that the microcapsules are selectively photocured corresponding to the image on the image carrying sheet upon exposure to light bearing image. A color developer sheet is then superposed on the recording sheet with the latent image formed thereon, and the two sheets are pressed by a pair of pressure developing rollers. Those microcapsules which have not been photocured are ruptured by the application of pressure, thereby allowing the dye precursors to flow out of the ruptured microcapsules and react with the color developer coated on the color developer sheet. Thus, the latent image formed on the photosensitive and pressure-sensitive recording sheet is transferred onto the color developer sheet.

The photosensitive and pressure sensitive recording sheet is normally in the form of a continuous, elongated web-like sheet and the color developer sheet is in the form of a cut sheet. The cut sheets are placed on by one over the continuous sheet, and there is an area on the photosensitive and pressure sensitive recording sheet on which the the color developer sheet is not superposed. When the photosensitive and pressure sensitive recording sheet passes through a nip between the pressure developing rollers, the microcapsules in the non-superposed region are ruptured and the dye precursours flow out of the microcapsules. Such dye precursors tend to attach to the surfaces of the pressure developing rollers and deposit thereon, whereby pressure irregularities are caused. Japanese Laid-Open Patent Publication No. 55-142373 discloses a device for preventing such pressure irregularities from being produced. The disclosed device has a hydraulic mechanism for controlling the movement of the pressure developing rollers into and out of contact with each other so that only an area where the photosensitive and pressure-sensitive recording sheet and the color developer sheet are superposed on each other can be pressed by the pressure developing rollers.

However, the hydraulic mechanism for controlling the pressure developing rollers is complex and costly. The operation of the hydraulic mechanism for controlling these rollers is a bar to contemplation of shortening the time of a recording or copying cycle. The movement of the rollers toward and away from each other in each pressure developing cycle is likely to cause a sheet jam.

One conceivable solution may be to attach cams o the respective opposite ends of one of the pressure developing rollers which are normally urged in a pressing direction by suitable means. The cams attached to one roller coact with the other roller to cyclically displace the rollers into and out of contact with each other. Since considerably large pressure is required to be applied to rupture the microcapsules, a large-size, high-torque motor has to be employed as a drive source for moving the pressure developing rollers against each other to develop such considerably large pressure.

SUMMARY OF THE INVENTION

It is an object of the present invention to provide a pressure developing device having pressure developing rollers which are free from dye precursor deposits and prevent pressure irregularities from being developed when pressing a photosensitive and pressure-sensitive recording sheet and a color developer sheet against each other.

According to the present invention, there is provided a pressure developing device for pressing a photosensitive and pressure-sensitive recording sheet with a latent image formed thereon and a color developer sheet in overlapping relation to develop the latent image into a visible image and transfer the visible image onto the color developer sheet. The pressure developing device comprises a pair of pressure developing rollers having respective pressing surfaces for pressing the photosensitive and pressure-sensitive recording sheet and the color developer sheet. At least one of the pressing surfaces has a non-pressing surface extending axially of the pressure developing roller having said at least one pressure surface.

The pressure developing device is arranged so that the non-pressing surface of the pressing roller is cyclically brought into registry with leading and trailing ends of the color developer sheet held in overlapping relation to the photosensitive and pressure-sensitive recording sheet when the sheets are fed into the pressure developing device. With such an arrangement, only the area on the photosensitive and pressure-sensitive recording sheet on which the color developer sheet is superposed is pressed by the pressure developing rollers, and hence microcapsules on the photosensitive and pressure-sensitive recording sheet which are ruptured by the pressure developing rollers are confined to that area. Consequently, dye precursors will not attach to the pressing surfaces of the pressure developing rollers, and any pressure irregularity which would otherwise be caused by unwanted dye precursor deposits will be avoided.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENTS

Figure 1:
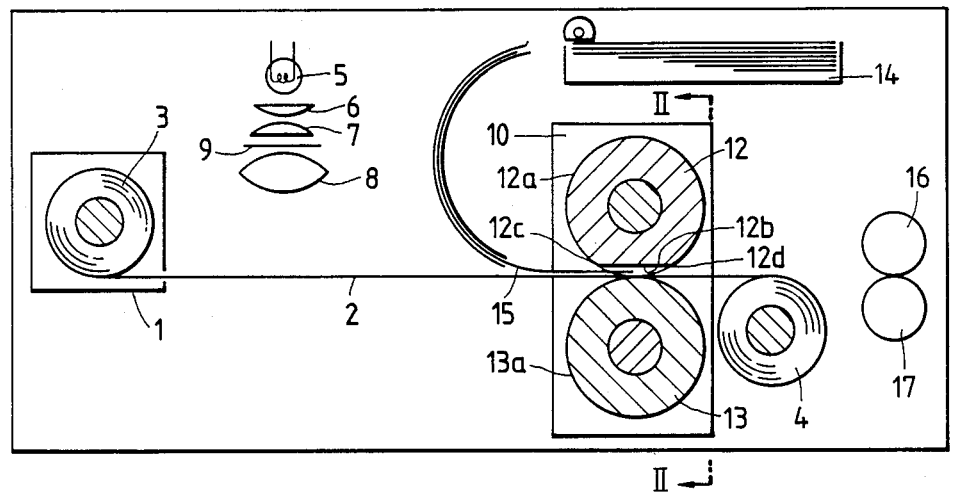
FIG. 1 is a schematic vertical cross-sectional view of an image recording apparatus or copying apparatus incorporating a pressure developing device according to the present invention.

As shown in FIG. 1, an image recording apparatus or copying apparatus has a light-shielding case 1 housing a supply roll 3 of a photosensitive and pressure-sensitive recording sheet 2. The supply roll 3 is rotatable intermittently about its own axis in timed relation to a takeup roll 4 by a drive unit (not shown) for withdrawing the photosensitive and pressure-sensitive recording sheet 2 from the case 1 into an exposure zone below a halogen lamp 5. The photosensitive and pressure-sensitive recording sheet 2 is coated on one surface thereof (upper surface in FIG. 1) with photocuring microcapsules encapsulating dye precursors. Underneath the halogen lamp 5, there are disposed a pair of condenser lenses 6, 7 and a focusing lens 8 with an image bearing slide film 9 interposed between the condenser lens pair and the focusing lens 8. When the halogen lamp 5 is energized, the microcapsules on the photosensitive and pressure-sensitive recording sheet 2 in the exposure zone are selectively photocured by exposure to light having passed through the slide film 9, so that the image on the slide film 9 will be recorded as a pattern of photocuring microcapsules on the photosensitive and pressure-sensitive recording sheet 2.

Figure 2:
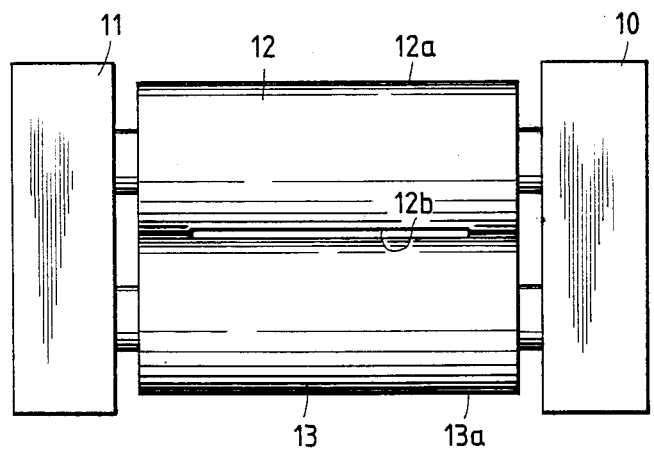
FIG. 2 is a cross-sectional view taken along line II—II of FIG. 1.

The photosensitive and pressure-sensitive recording sheet 2 is then fed from the exposure zone along a path toward the takeup roll 4. A pair of support stands 10, 11 (FIGS. 1 and 2) are disposed alongside of the path of the photosensitive and pressure-sensitive recording sheet 2. Upper and lower pressure developing rollers 12, 13 are rotatably supported between the support stands 10, 11, and are adjustably supported to regulate the pressure developed therebetween. The pressure developing rollers 12, 13 is driven by a drive unit (not shown) to rotate about their own axes in timed relation to the intermittent movement of the photosensitive and pressure-sensitive recording sheet 2. The upper pressure developing roller 12 has a circumferential pressing surface 12a and a non-pressing surface 12b extending axially of the roller 12 and terminating short of the axially opposite ends of the roller 12. The non-pressing surface 12b is shown here as a flat surface lying parallel to the axis of the roller 12. Boundaries 12c, 12d between the pressing surface 12a and the non-pressing surface 12b smoothly harmonize with these surfaces 12a, 12b. The boundaries 12c, 12d are configured in cross section with a uniform-velocity curve depicted about the axis of rotation of the roller 12 in a polar coordinate plane normal to the axis of rotation of the roller, with the angle of the curve being a variable. Each of the pressure developing rollers 12, 13 has a circumferential length which is substantially the same as the length of a color developer sheet 15, and is fed from a sheet cassette 14 in timed relation to the intermittent travel of the photosensitive and pressure-sensitive recording sheet 2. When the pressure developing rollers 12, 13 are stopped, the non-pressing surface 12b faces the path of movement of the photosensitive and pressure-sensitive recording sheet 2 between the pressure developing rollers 12, 13.

The color developer sheet 15 is superposed on the photosensitive and pressure-sensitive recording sheet 2 which has been exposed to light from the halogen lamp 5 and the two sheets 2, 15 are fed between the pressure developing rollers 12, 13, whereupon the sheets 2, 15 are pressed against each other by the pressure developing rollers 12, 13. As shown in FIG. 1, the leading end of the color developer sheet 15 is introduced into a gap between the nonpressing surface 12b of the upper roller 12 and the circumferential pressing surface 13a of the lower roller 13, whereupon the rollers 12, 13 are driven to rotate about their own axes. The photosensitive and pressure-sensitive recording sheet 2 which has been exposed to light and the color developer sheet 15, as they overlap each other, are pressed against each other between the pressing surfaces 12a, 13a of the pressure developing rollers 12, 13. The color developer sheet 15 is pressed in a region except its leading and trailing ends, whereas the photosensitive and pressure-sensitive recording sheet 2 is pressed only in its area which overlaps the color developer sheet 15. Therefore, the microcapsules which are ruptured are only those in the area where the sheets 2, 15 overlap each other. The dye precursors flowing out of the ruptured microcapsules react with the color developer on the color developer sheet 15, but do not attach to the pressing surface 12a of the pressure developing roller 12 confronting the microcapsule-coated surface of the photosensitive and pressure-sensitive recording sheet 2. The latent image on the photosensitive and pressure-sensitive recording sheet 2 is developed into a visible image and transfer the visible image and transferred onto the color developer sheet 15. Since no dye precursor is attached to the pressing surfaces 12a, 13a, the sheets 2, 15 can be pressed against each other under uniform pressure. Therefore, reproduction of the image is accomplished uniformly over the entire surface of the color developer sheet 15.

The pressure developing rollers 12, 13 can press the sheets 2, 15 without having to move toward each other. Therefore, any mechanism for moving the pressure developing rollers 12, 13 toward and away from each other is not required. Further, the time of a pressing cycle in which the pressure developing rollers 12, 13 are pressed to develop the image is shortened. The mechanism associated with the pressuring developing rollers 12, 13 is simpler and the pressing cycle time is shorter than those of the conventional pressure developing devices.

After the photosensitive and pressure-sensitive recording sheet 2 and the color developer sheet 15 have been pressed, the former sheet 2 is wound around the takeup roll 4, and the latter sheet 15 is introduced into a nip between a pair of thermal fixing rollers 16, 17 by which the image on the color developer sheet 15 is thermally fixed.

When the photosensitive and pressure-sensitive recording sheet 2 and the color developer sheet 15 start being pressed, i.e., when the pressure developing rollers 12, 13 start rotating from the condition in which the nonpressing surface 12b and the pressing surface 13a face each other into the condition in which the pressing surfaces 12a, 13a are pressed against each other, the boundary 12c defined by a uniform velocity curve allows the sheets 2, 15 to be introduced smoothly between the pressing surfaces 12a, 13a without applying excessive pressure to these pressing surfaces 12a, 13a. Therefore, microcapsules on the photosensitive and pressure-sensitive recording sheet 2 are prevented from being unduly ruptured between the boundary 12c and the pressing surface 13a, and hence any unwanted linear image which would otherwise be caused by undesired microcapsule rupture will not be produced. When one pressure cycle is about to be completed, no microcapsules are ruptured by the other boundary 12d.

Although a certain preferred embodiment has been shown and described, it should be understood that many changes and modifications may be made therein without departing from the scope of the appended claims.

For example, the boundaries 12c, 12d may be defined in its circumferential shape by a uniform acceleration curve in which increment or decrement of acceleration is at a constant value, a curve in which increment or decrement of acceleration is changed at a constant rate, an involute curve, or a cycloid curve.

Both of the upper and lower pressure developing rollers 12, 13 may have respective non-pressing surfaces, or only the lower pressure developing roller 13 may have a nonpressing surface. Alternatively, if the circumferential length of a pressure developing roller used is substantially equal to the product of the length of a color developer sheet used by an integer, then it is possible to provide as many non-pressing surfaces as the integer on the pressing surface of the pressure developing roller at angularly equally spaced locations.

Although a certain preferred embodiment has been shown and described, it should be understood that many changes and modifications may be made therein without departing from the scope of the appended claims.

What is claimed is:

1. In an image recording apparatus of the type in which a color image on an image carrying sheet is recorded on a developer sheet wherein said color image is formed as a latent image on a photosensitive and pressure-sensitive recording sheet upon exposure to light which bears said color image, and said latent image is developed into a visible color image and transferred onto said developer sheet superposed on said photosensitive and pressure-sensitive recording sheet by a pressure developing device, said device comprising a pair of rollers, each of said pair of rollers being rotatable about its own axis and having a first surface area on its periphery wherein each of said first surface areas are in pressure contact with each other to pressure develop said latent image and transfer said visible color image when said photosensitive and pressure-sensitive recording sheet and said developer sheet held in superposed relation are passed through a nip between said first surface areas, and at least one of said pair of rollers having a second surface area on its periphery, said second surface area extending axially of said roller wherein said second surface is free from pressure contact with another roller.

2. A pressure developing device as set forth in claim 1, wherein at least one of said pair of rollers has a pressure-moderation area provided between said first and said second surface areas for moderating pressure applied to said photosensitive and pressure-sensitive sheet and said developer sheet, said pressure-moderation area being configured in cross section with a curve smoothly connecting said first and said second surface areas.

3. A pressure developing device as set forth in claim 2, wherein said pressure-moderation area is configured in cross section with a uniform-velocity curve depicted about the axis of said roller in a polar coordinate plane normal to the axis of said roller.

4. A pressure developing device as set forth in claim 2, wherein said curve is a uniform accelleration curve.

5. A pressure developing device as set forth in claim 2, wherein said curve is an involute curve.

6. A pressure developing device as set forth in claim 2, wherein said curve is a cycloid curve.

* * * * *